US010742467B1

(12) United States Patent
Civerolo et al.

(10) Patent No.: US 10,742,467 B1
(45) Date of Patent: Aug. 11, 2020

(54) DIGITAL DYNAMIC DELAY FOR ANALOG POWER SAVINGS IN MULTICARRIER BURST WAVEFORMS

(71) Applicant: Government of the United States as represented by the Secretary of the Navy, San Diego, CA (US)

(72) Inventors: Michael P. Civerolo, San Diego, CA (US); Nicholas A. Lumsden, Escondido, CA (US); Drew E. Overturf, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 16/508,047

(22) Filed: Jul. 10, 2019

(51) Int. Cl.
*H04L 27/26* (2006.01)
(52) U.S. Cl.
CPC ...... *H04L 27/2614* (2013.01); *H04L 27/2627* (2013.01)
(58) Field of Classification Search
None
See application file for complete search history.

(56) References Cited

U.S. PATENT DOCUMENTS

| | | | | |
|---|---|---|---|---|
| 3,513,412 A | * | 5/1970 | Breetz | H03B 21/02 332/144 |
| 3,755,814 A | * | 8/1973 | Alpers | G01S 13/82 342/42 |
| H000607 H | * | 3/1989 | Pryluck | 711/104 |
| 4,871,961 A | * | 10/1989 | Kersten | H03K 17/16 323/267 |
| 4,945,463 A | * | 7/1990 | Dangschat | H02M 3/33507 363/16 |
| 5,052,799 A | * | 10/1991 | Sasser | G01C 21/26 180/168 |
| 5,235,504 A | * | 8/1993 | Sood | H02M 1/4208 363/53 |
| 5,559,395 A | * | 9/1996 | Venkitasubrahmanian | H05B 41/36 315/247 |
| 5,604,411 A | * | 2/1997 | Venkitasubrahmanian | H05B 41/3924 315/307 |
| 5,650,694 A | * | 7/1997 | Jayaraman | H05B 41/2828 315/225 |
| 5,691,605 A | * | 11/1997 | Xia | H05B 41/3921 315/307 |

(Continued)

*Primary Examiner* — Berhanu Tadese
(74) *Attorney, Agent, or Firm* — Naval Information Warfare Center, Pacific; Kyle Eppele

(57) ABSTRACT

A signal processor is provided for use with a first signal generator and a second signal generator, wherein the first signal generator provides a first signal having a first amplitude and the second signal generator provides a second signal having a second amplitude. The signal processor includes: a threshold component that stores a threshold value; a threshold detection component that generates a sum of the first amplitude and the second amplitude, compares the sum with the threshold value, generates a modification required signal when the sum is greater than the threshold value; a delay component that generates a delay signal; and a delay processor operable to output an output signal based on the sum of a modified first signal and the second signal when the sum is greater than the threshold value.

6 Claims, 7 Drawing Sheets

(56) References Cited

U.S. PATENT DOCUMENTS

| | | | | |
|---|---|---|---|---|
| 5,710,990 A * | 1/1998 | Long | H01Q 3/26 | 455/103 |
| 5,740,241 A * | 4/1998 | Koenig | H04M 3/005 | 323/270 |
| 5,754,036 A * | 5/1998 | Walker | G05F 1/66 | 323/235 |
| 6,807,343 B2 * | 10/2004 | Tulchinsky | H01Q 3/2676 | 385/140 |
| 6,882,217 B1 * | 4/2005 | Mueller | H03F 1/3241 | 330/2 |
| 7,020,188 B2 * | 3/2006 | Taunton | H04L 27/0002 | 375/222 |
| 8,687,734 B1 * | 4/2014 | Chester | H04L 27/2614 | 370/208 |
| 8,995,542 B2 * | 3/2015 | Kumar | H04L 27/2602 | 375/259 |
| 9,042,434 B2 * | 5/2015 | Smart | H03H 17/0263 | 375/232 |
| 9,655,077 B1 * | 5/2017 | Roth | G01S 5/14 | |
| 9,657,708 B2 * | 5/2017 | Bogorodsky | F03B 3/18 | |
| 2002/0101936 A1 * | 8/2002 | Wright | H04L 27/2624 | 375/296 |
| 2003/0026331 A1 * | 2/2003 | Taunton | H04L 27/0002 | 375/222 |
| 2006/0014500 A1 * | 1/2006 | Marsili | H04L 27/2624 | 455/115.1 |
| 2007/0099579 A1 * | 5/2007 | Clausen | H04L 27/2624 | 455/75 |
| 2007/0121736 A1 * | 5/2007 | Clausen | H04L 27/2618 | 375/260 |
| 2008/0019453 A1 * | 1/2008 | Zhao | H04L 27/2623 | 375/260 |
| 2008/0043616 A1 * | 2/2008 | Clausen | H04L 27/2624 | 370/210 |
| 2008/0247487 A1 * | 10/2008 | Cai | H04L 27/2623 | 375/296 |
| 2011/0009153 A1 * | 1/2011 | Chiba | H04L 27/2623 | 455/522 |
| 2011/0182339 A1 * | 7/2011 | Kang | H04L 27/2624 | 375/224 |
| 2011/0227628 A1 * | 9/2011 | Sato | H03F 3/245 | 327/361 |
| 2012/0093209 A1 * | 4/2012 | Schmidt | H04L 27/2624 | 375/224 |
| 2012/0188000 A1 * | 7/2012 | Chen | H03K 17/28 | 327/401 |
| 2013/0002187 A1 * | 1/2013 | Spreen | H02P 23/0077 | 318/811 |
| 2013/0004180 A1 * | 1/2013 | Gupta | H04L 27/2096 | 398/115 |
| 2013/0022208 A1 * | 1/2013 | Dhuyvetter | H03G 11/002 | 381/55 |
| 2013/0070379 A1 * | 3/2013 | Pan | H02H 3/093 | 361/87 |
| 2014/0044215 A1 * | 2/2014 | Mundarath | H04L 27/2624 | 375/297 |
| 2015/0004923 A1 * | 1/2015 | Beaudin | H04B 1/04 | 455/127.2 |
| 2016/0036561 A1 * | 2/2016 | Stopler | H04L 27/3863 | 714/776 |
| 2016/0333844 A1 * | 11/2016 | Bogorodsky | F03B 13/06 | |
| 2017/0033964 A1 * | 2/2017 | Shih | H04L 27/2624 | |
| 2017/0184072 A1 * | 6/2017 | Zabala | F03B 13/24 | |
| 2018/0175905 A1 * | 6/2018 | Nabki | H04L 25/4902 | |
| 2018/0331873 A1 * | 11/2018 | Andre | H04B 1/0067 | |
| 2019/0334939 A1 * | 10/2019 | Singh | H04L 63/1416 | |
| 2020/0052656 A1 * | 2/2020 | Dezfooliyan | H04L 27/2626 | |

\* cited by examiner

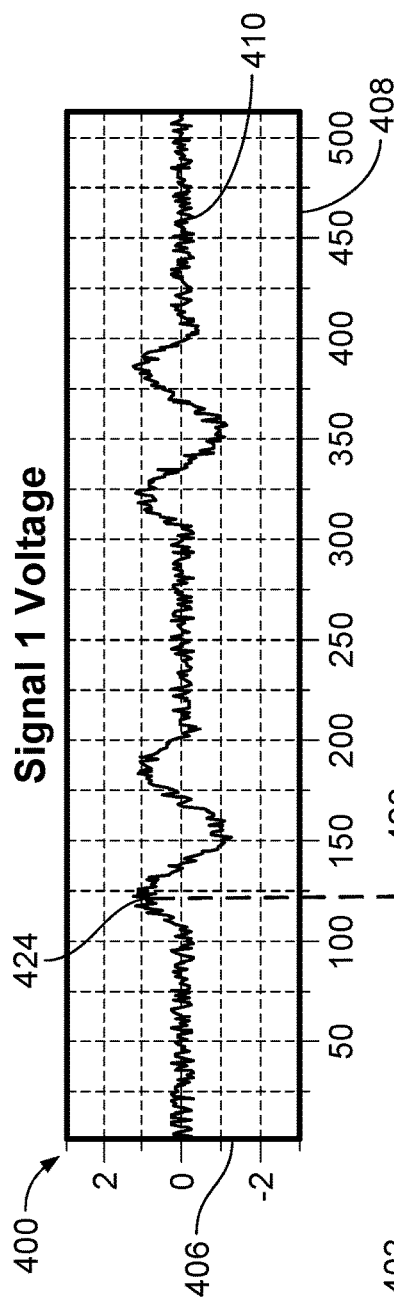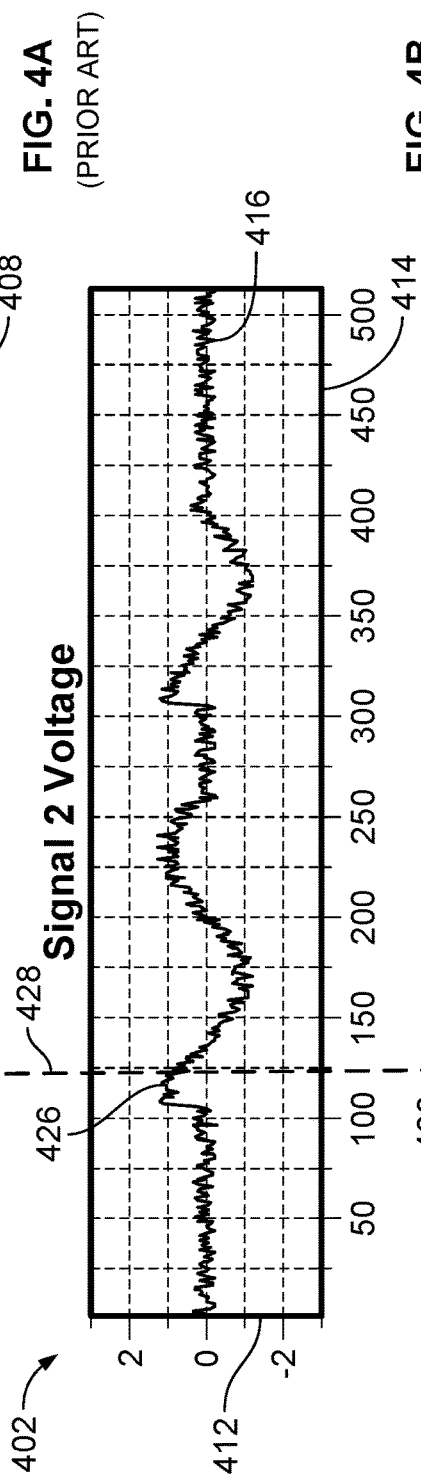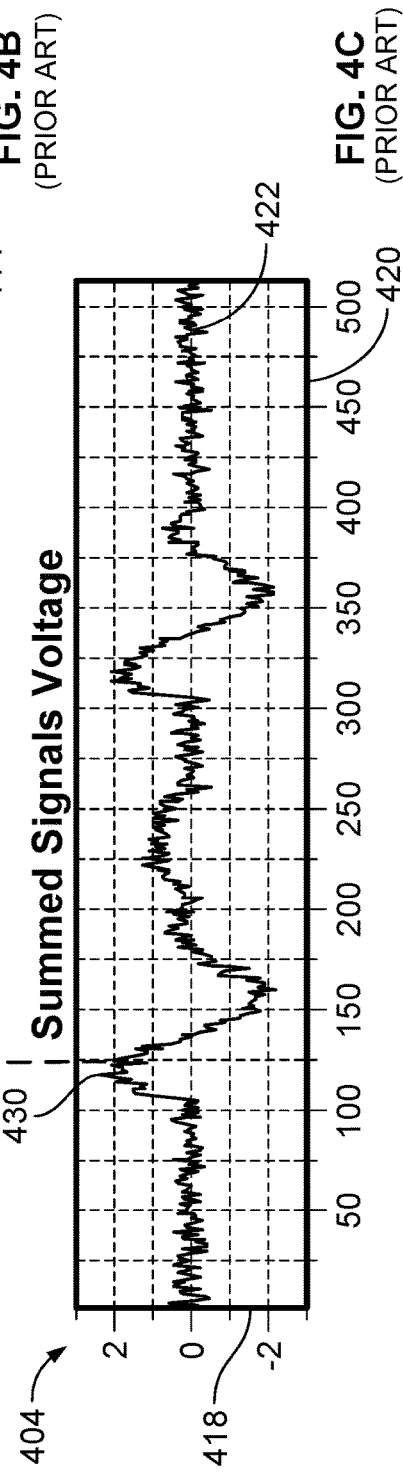

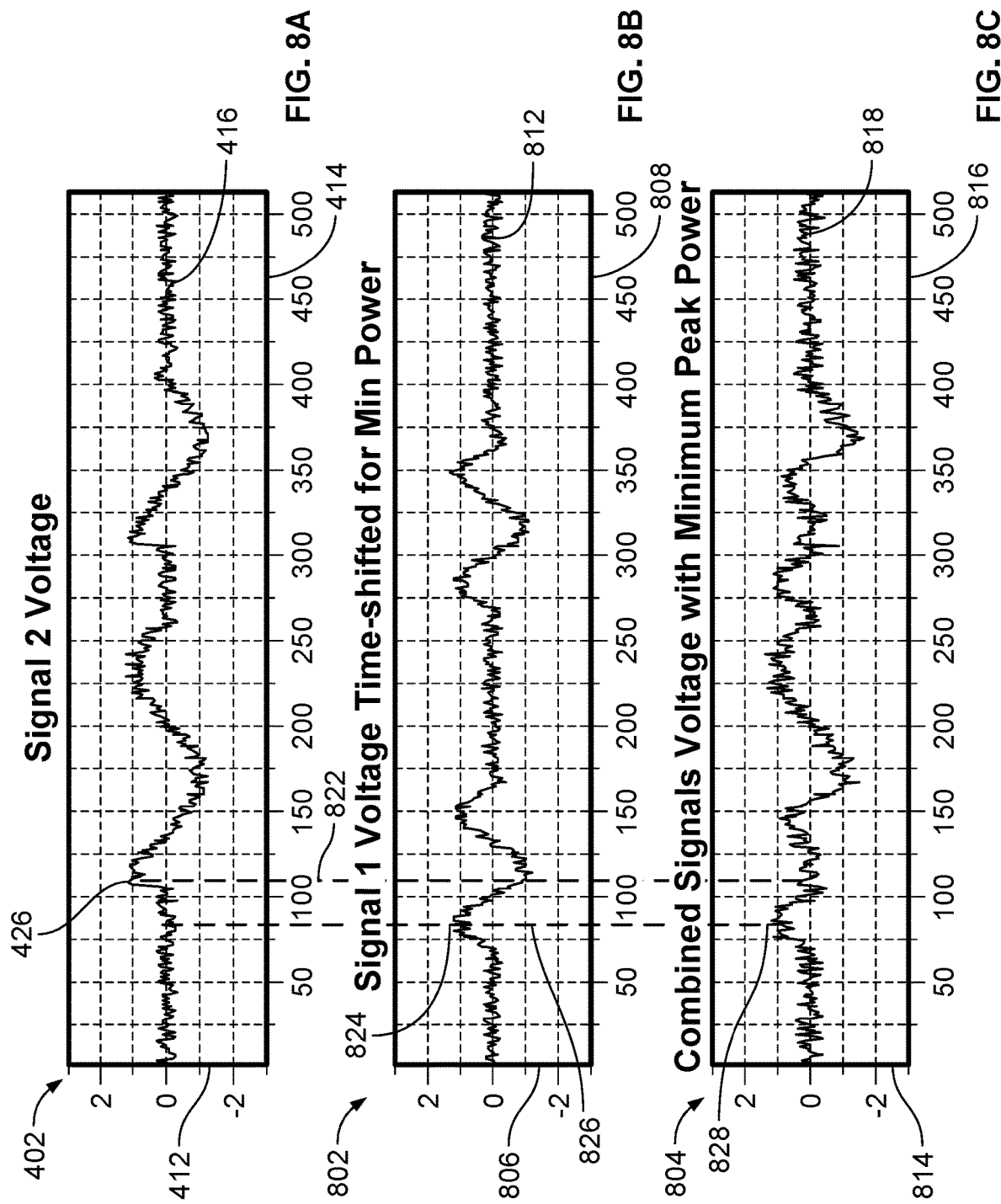

DIGITAL DYNAMIC DELAY FOR ANALOG POWER SAVINGS IN MULTICARRIER BURST WAVEFORMS

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 3600, San Diego, Calif., 92152; telephone (619)553-3001; email: ssc_pac_t2@navy.mil. Reference Navy Case No. 104222.

BACKGROUND

Embodiments of the disclosure relate to an amplifier for multiple non-continuous (i.e., bursted) signals. There are many systems (commercial cell phone, radar, wireless communications, wireless networks, etc.) where multiple signals on different carrier frequencies are simultaneously transmitted and therefore require a great amount of peak power handling capability when the voltage peaks of the individual signals coincide in time. What is needed is a system and method that reduces the likelihood of the waveform peaks coinciding in time while still maintaining waveform performance.

Many wireless systems (radars, communication systems, networks, etc.) have multiple unique signals being transmitted simultaneously through a single radio frequency (RF) front end and/or antenna aperture. The analog circuitry must be designed to handle the summed average power of the multiple signals as well as the summed peak power of the multiple signals. Many times, the concurrent voltage peaks of the simultaneous signals either drive high peak power handling requirements in the front end analog circuitry or cause non-linear undesired effects when they surpass the peak power linearity rating of the front end circuitry. These undesired peak power issues occur when strong voltage peaks in the simultaneous signals align in time and cause a large power spike in the analog front end.

Prior art transmission systems will now be described with reference to FIGS. 1-5. FIG. 1 illustrates a prior art transmission system 100. As shown in the figure, transmission system 100 includes: a plurality of signal generators, a sample of which are indicated as a signal generator 102, a signal generator 104, a signal generator 106; a pre-processor 108; a high power amplifier (HPA) 112 and a transmitter 114.

Signal generators 102, 104, and 108 are arranged to communicate with pre-processor 108 via a communication channel 116. Pre-processor 108 is additionally arranged to communicate with HPA 112 via a communication channel 118. HPA 112 is additionally arranged to communicate with transmitter 114 via a communication channel 120.

In operation, the plurality of signal generators may generate respective bursted, or non-continuous, signals. For example, signal generator 102 generates a non-continuous signal 117 for transmission, signal generator 104 generates a non-continuous signal 119 for transmission and signal generator 106 generates a non-continuous signal 121 for transmission. Non-continuous signals 117, 119 and 121 are provided to pre-processor 108.

Pre-processor 108 may process non-continuous signals 117, 119 and 121 in any known manner to address cross-channel interference that might be created in HPA 112, so as to output a pre-processed signal indicated by arrow 128.

HPA 112 will sum and amplify the pre-processed signals and output an amplified signal 130 to transmitter 114. Transmitter 114 will transmit an output signal 132 based on amplified signal 130.

Typically HPA 112 will be driven very close to saturation, wherein it is most efficient. Because HPA 112 is driven close to saturation it must be designed such that the maximum amplitude of the sum of all the pre-processed signals, at any single time, does not exceed its saturation point.

Cellular transmission towers, that are similar to prior art transmission system 100, are typically designed to handle thousands of simultaneous signals. Accordingly, there is a high likelihood that at any given moment, many if not all of the handled signals will individually have a maximum amplitude. Therefore an HPA in such a cellular communications tower would be designed to handle a large number of pre-processed signals, whose amplitudes at any time may be summed and still not push the HPA beyond its saturation point.

Although such an HPA might not be driven close to saturation, and thus not optimally efficient, all the time, it is likely to be driven close to saturation, and thus optimally efficient, most of the time.

Some transmission systems do not need to handle a large number of signal generators at a single time. For example, some military mobile communication platforms are designed to transmit a predetermined low number of signals. This will be described with reference to FIG. 2.

FIG. 2 illustrates another prior art transmission system 200. As shown in the figure, transmission system 200 includes a signal generator 202, a signal generator 204, a pre-processor 206, an HPA 208 and transmitter 114.

Signal generator 202 is arranged to communicate with pre-processor 206 via a communication channel 210. Signal generator 204 is arranged to communicate with pre-processor 206 via communication channel 210. Pre-processor 206 is additionally arranged to communicate with HPA 208 via a communication channel 212. HPA 208 is additionally arranged to communicate with transmitter 114 via a communication channel 214.

In operation, signal generator 202 generates a non-continuous signal 216 for transmission and signal generator 204 generates a non-continuous signal 218 for transmission. Non-continuous signals 216 and 218 are provided to pre-processor 206. Pre-processor 206 may process non-continuous signals 216 and 218 in any known manner to address cross-channel interference that might be created in HPA 208, so as to output pre-processed signals represented by arrow 220.

HPA 208 will sum and amplify pre-processed signals and output an amplified signal 222 to transmitter 114. Transmitter 114 will transmit an output signal 224 based on amplified signal 222.

Again, HPA 208 will be designed so as to be driven very close to saturation, wherein it is most efficient. Because HPA 208 is driven close to saturation it must be designed such that the sum of the maximum amplitude of each of the pre-processed signals at any single time does not exceed its saturation point.

As opposed to transmission system 100 discussed above, which may include a large number of signal generators, in transmission system 200, HPA 208 has been designed to optimally work near saturation so as to amplify a combination of two input signals, namely non-continuous signal 216 and non-continuous signal 218. In particular, HPA 208 will be designed such that its saturation point is near the sum of the maximum amplitude of the sum of each of the preprocessed signals corresponding to non-continuous signal 216 and non-continuous signal 218.

HPA 208 might not optimally operate when the sum of the maximum amplitude of each of the pre-processed signals at any single time is not near the saturation point, which will likely be much of the time as there are only two signals. However, this system is designed to support a fixed predetermined number of input signals.

If another signal generator is added to transmission system 200, then there may be instances when the combination of input signals surpasses the saturation point of HPA 208, thus drastically reducing the signal to noise ratio of amplified signal 222. This will be described in greater detail with reference to FIGS. 3-4.

FIG. 3 illustrates another prior art transmission system 300. As shown in the figure, transmission system 300 includes: a plurality of signal generators, a sample of which are indicated as signal generator 202, signal generator 204 and a signal generator 302; pre-processor 206, HPA 208 and transmitter 114.

Signal generator 202 is arranged to communicate with pre-processor 206 via a communication channel 304. Signal generator 204 is arranged to communicate with pre-processor 206 via communication channel 304. Signal generator 302 is arranged to communicate with pre-processor 206 via communication channel 303. Pre-processor 206 is additionally arranged to communicate with HPA 208 via communication channel 212. HPA 208 is additionally arranged to communicate with transmitter 114 via communication channel 214.

Transmission system 300 differs from transmission system 200 of FIG. 2 discussed above, in that transmission system 300 included additional signal generators, a sample of which is indicated as signal generator 302. In operation, the plurality of signal generators generate respective non-continuous signals, a sample of which are indicated as non-continuous signal 216 from signal generator 202, non-continuous signal 218 from signal generator 202 and non-continuous signal 306 from signal generator 302. The plurality of generated signals is provided to pre-processor 206.

Pre-processor 206 may process the plurality of signals in any known manner to address cross-channel interference that might be created in HPA 208, so as to output pre-processed signals represented by arrow 308.

HPA 208 will sum and amplify the pre-process signals and output an amplified signal 310 to transmitter 114. Transmitter 114 will transmit an output signal 312 based on amplified signal 310.

Again, in this example HPA 208 had been designed so as to be driven very close to saturation, wherein it is most efficient. Further, in this example, as discussed above with reference to FIG. 2, HPA 208 had been designed such that the sum of the maximum amplitude of each of the pre-processed signals, which only included non-continuous signal 216 and non-continuous signal 218, at any single time would not exceed its saturation point.

However, in this example, HPA 208 is amplifying the pre-processed signals, which includes non-continuous signal 216 and non-continuous signal 218, in addition to a plurality of other generated signals, such as signal 306. Accordingly, in transmission system 300, there is a possibility that the combination of input signals from the plurality of additional signal generators will result in instances of the sum of the maximum amplitudes of each of the pre-processed signals being greater than the input voltage of HPA 208 as driven at saturation. This will be described in greater detail with respect to FIGS. 4A-C.

FIG. 4A illustrates a graph 400 associated with a signal 410 of signal generators 202 and 204 of transmission system 300 of FIG. 3. FIG. 4B illustrates a graph 402 associated with a signal 416 of signal generator 302 of transmission system 300. FIG. 4C illustrates a graph 404 associated with a sum of signal 410 and signal 416.

Graph 400 has a y-axis 406 of voltage and an x-axis 408 of time. Graph 402 has a y-axis 412 of voltage and an x-axis 414 of time. Graph 404 has a y-axis 418 of voltage and an x-axis 420 of time.

It should be noted that signal 410 in graph 400 is provided for discussion purposes only, wherein the signals generated by signal generator 202 and signal generator 204 are not independently added together separately from the signals generated by the other signal generators. In particular the graphs of FIGS. 4A-C are provided to illustrate a problem when an additional signal generator is added to a transmission system that has an HPA that is designed for less than the number of signal generators being used, which is the situation described above with reference to transmission system 300 of FIG. 3.

As shown in graph 400, signal 410 has a maximum amplitude of approximately 1.0 milli-Volts (mV) at position 424, which corresponds to a time of 125 milliseconds (ms). As shown in graph 402, signal 416 has a maximum amplitude of approximately 1.0 mV at position 426, which corresponds to the time of 125 ms, which is indicated by dotted line 428. The superposition (sum) of signal 410 and signal 416 is illustrated as signal 422 in graph 404. Signal 416 has a maximum amplitude of approximately 2.0 mV at position 430, which corresponds to the time of 125 ms, which is along dotted line 428.

For purposes of discussion, let HPA 208 operate at saturation at a voltage of 1.5 mV. If such is the case, in FIG. 4C, at the time of 125 ms, identified by dotted line 428, the amplitude of signal 422 will surpass the saturation of HPA 208. Accordingly, at the time of 125 ms, amplified signal 310 that is output by HPA 208 will have an unacceptable amount of distortion, or in other words, an unacceptable signal to noise ratio.

To address this issue of distortion, when additional signal generators are added to transmission system 200, for example to create transmission system 300, a new HPA must be designed and provided. This will be described with additional reference to FIG. 5.

FIG. 5 illustrates another prior art transmission system 500.

As shown in the figure, transmission system 500 includes: the plurality of signal generators, a sample of which are indicated as signal generator 202, signal generator 204 and signal generator 302; pre-processor 206, an HPA 502 and transmitter 114.

Transmission system 500 is similar to transmission system 300 discussed above with reference to FIG. 3, but differs in that HPA 208 of transmission system 300 has been replaced with an HPA 502 in transmission system 500.

In operation, the plurality of signal generators generate respective non-continuous signals, a sample of which are indicated as non-continuous signal 216 from signal generator 202, non-continuous signal 218 from signal generator 202 and non-continuous signal 306 from signal generator 302. The plurality of generated signals is provided to pre-processor 206.

Pre-processor 206 may process the plurality of signals in any known manner to address cross-channel interference that might be created in HPA 502, so as to output the pre-processed signals represented by arrow 308. HPA 502 will sum and amplify the pre-processed signals and output an amplified signal 504 to transmitter 114. Transmitter 114 will transmit an output signal 506 based on amplified signal 504.

Again, in this example HPA 502 has been designed so as to be driven very close to saturation, wherein it is most efficient. Further, in this example, as compared to HPA 208 as discussed above with reference to FIG. 3, HPA 502 had been designed such that the sum of the maximum amplitudes of each of the pre-processed signals, at any time, would not exceed its saturation point.

In the prior art transmission systems discussed above, there are two separate options. Option one, a transmission system is created that can support a large number of signal generators, wherein the HPA is driven near saturation most of the time. Option two, an HPA is designed for a predetermined, smaller, number of signal generators, wherein the HPA is driven near saturation some of the time.

What is needed is a transmission system that may use an non-predetermined number of signal generators, wherein the HPA is driven near saturation some of the time. For example, a transmission system that may use an original number of signal generators, wherein the HPA is driven near saturation some of the time, and that may be modified to add additional signal generators, wherein the HPA will continue to be driven near saturation some of the time.

SUMMARY

An aspect of the present disclosure is drawn to a signal processor for use with a first signal generator and a second signal generator. The first signal generator is operable to provide a first signal having a first amplitude at a time $t_1$. The second signal generator is operable to provide a second signal having a second amplitude at time $t_1$. The signal processor includes a threshold component, a threshold detection component, a delay component and a delay processor. The threshold component is operable to store a threshold value. The threshold detection component is operable to generate a sum of the first amplitude and the second amplitude, to compare the sum with the threshold value, to generate a modification required signal when the sum is greater than the threshold value and to generate a modification not required signal when the sum is less than or equal to the threshold value. The delay component is operable to generate a delay signal. The delay processor is operable to output a first output signal based on the sum when the sum is less than or equal to the threshold, to generate a modified first signal by applying a time delay to the first signal when the sum is greater than the threshold value and to output a second output signal based on the sum of the modified first signal and the second signal when the sum is greater than the threshold value.

BRIEF DESCRIPTION OF THE DRAWINGS

The accompanying drawings, which are incorporated in and form a part of the specification, illustrate example embodiments and, together with the description, serve to explain the principles of the disclosure. A brief description of the drawings now follows.

FIG. 4A illustrates a graph associated with a signal of two signal generators of the prior art transmission system of FIG. 3.

FIG. 4B illustrates a graph associated with a signal of another signal generator of the prior art transmission system of FIG. 3.

FIG. 4C illustrates a graph associated with a sum of the signals of FIGS. 4A-B.

FIG. 8A illustrates a graph associated with a signal generator of the transmission system of FIG. 6.

FIG. 8B illustrates a graph associated with the signal of two other signal generators of the transmission system of FIG. 6, time delayed in accordance with the present disclosure.

FIG. 8C illustrates a graph associated with a sum of the signals of FIGS. 8A-B.

DETAILED DESCRIPTION OF THE EMBODIMENTS

Figure 1:
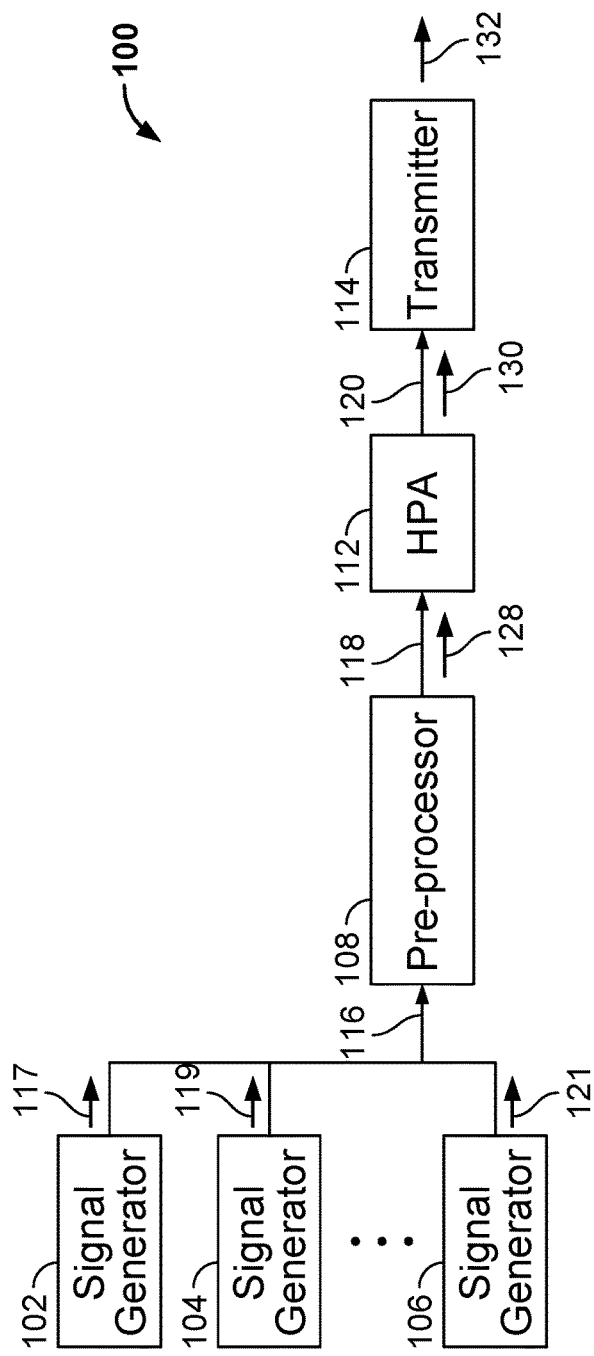
FIG. 1 illustrates a prior art transmission system.
Figure 2:
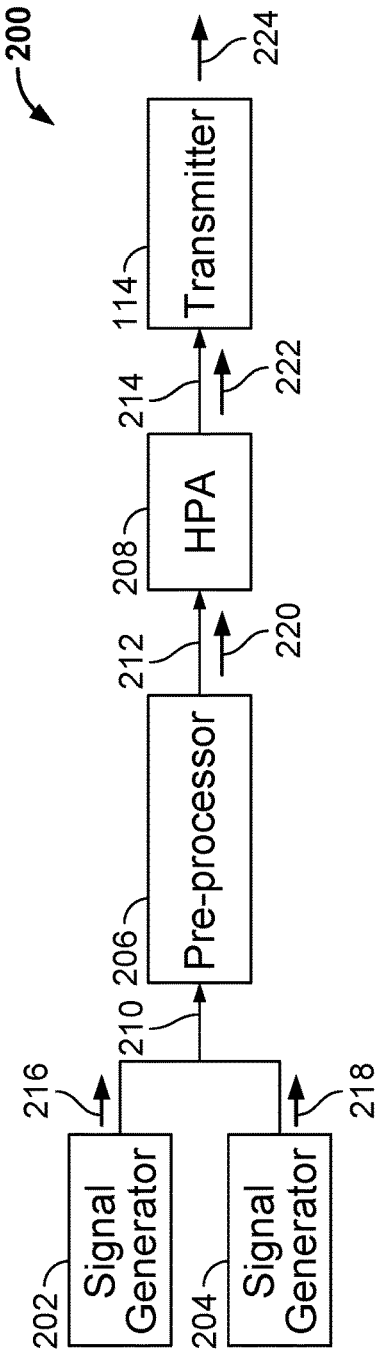
FIG. 2 illustrates another prior art transmission system.
Figure 3:
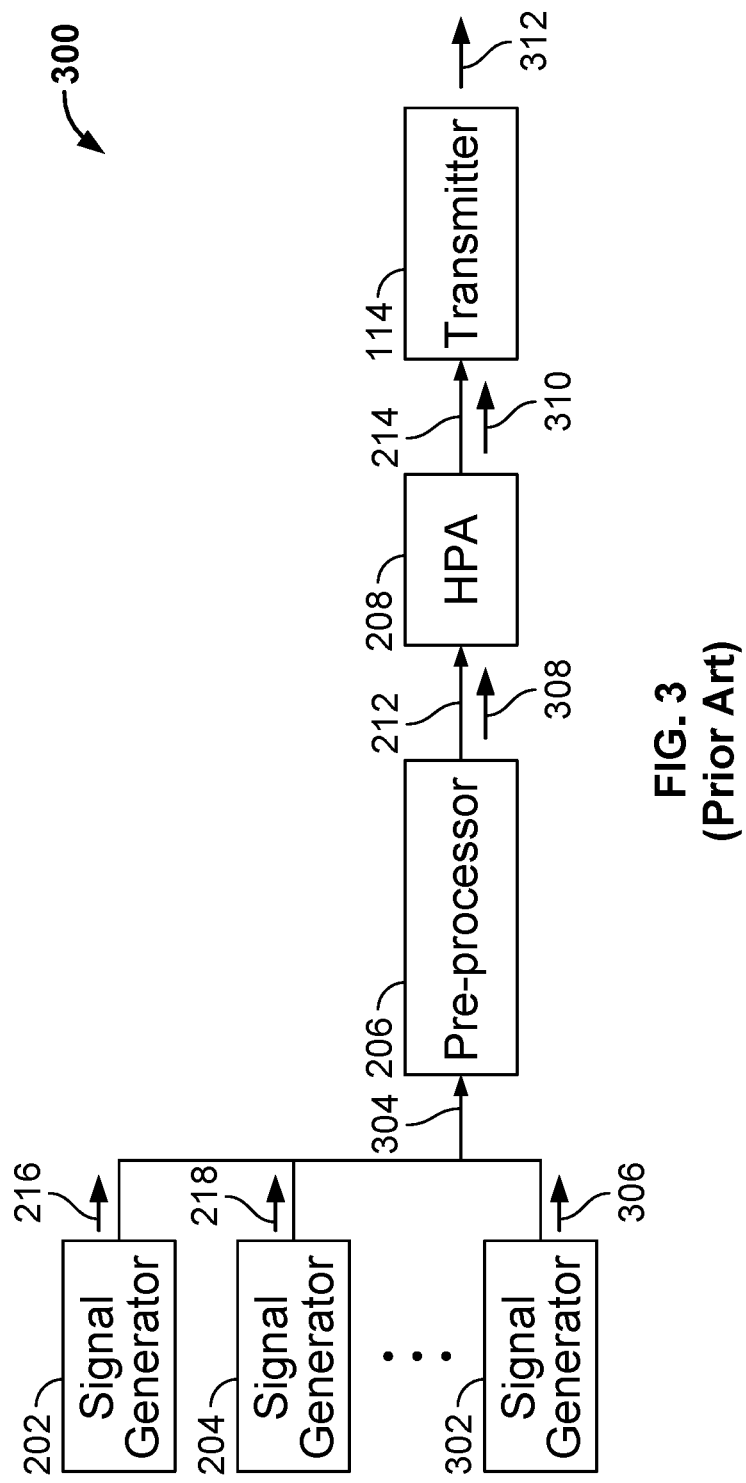
FIG. 3 illustrates another prior art transmission system.
Figure 5:
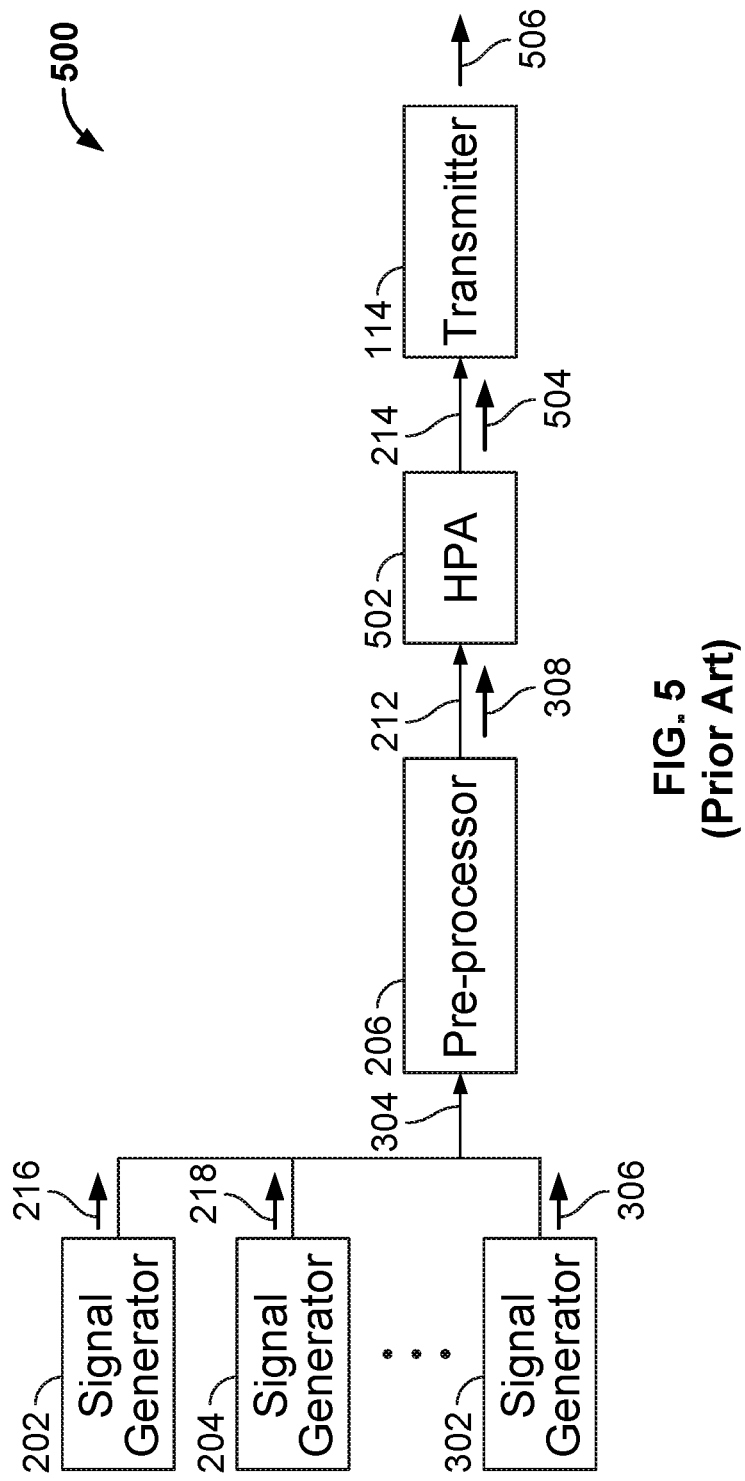
FIG. 5 illustrates another prior art transmission system.

A system in accordance with the present disclosure delivers a method to digitally anticipate and delay non-continuous (i.e. bursted) signals to reduce peak power requirements in systems where multiple signals on different carrier frequencies are present. There are many systems (commercial cell phone, radar, wireless communications, wireless networks, etc.) where multiple signals on different carrier frequencies are simultaneously transmitted and therefore require a great amount of peak power handling capability when the voltage peaks of the individual signals coincide in time, as indicated above with reference to FIGS. 1-5. A system in accordance with the present disclosure reduces the likelihood of the waveform peaks coinciding in time, while still maintaining waveform performance.

A smart digital delay technique in accordance with the present disclosure processes incoming digital signals to determine when their peaks align and adds strategic delays to the signals to ensure that their peaks do not occur simultaneously. This process will reduce the peak power handling requirements for analog front end hardware for systems that transmit multiple simultaneous signals and reduce the likelihood of undesired non-linear spikes. Most bursted signal waveforms are designed with timing buffers in the waveform timing design and can handle a certain amount of latency and small delays while still operating normally. Adding small delays to save power will not impact the performance of the wireless systems that have non-continuous (bursted) waveforms as long as the delay is less than the timing delay buffer designated by each individual waveform. This new digital technique will save peak power handling without degrading the throughput and wireless performance of systems.

A system in accordance with the present disclosure includes digital processing blocks that analyze multiple simultaneous signals and determine when an undesired alignment of voltage peaks might occur. When it is assessed that undesired peak alignment is likely, the system adds delays to prevent the undesired occurrence. 'N' number of signals come into this unique system and are evaluated to determine when a "high" voltage peak occurs in each signal. This is performed by comparing each time sample in each of the 'N' number of signals to see if the time sample is above (in absolute value) a voltage threshold for each signal. In an example embodiment, this may be a look-up table (LUT)

where each signal type has a static preset peak voltage threshold value, whereas in another example embodiment this may be a dynamically moving value based on the number of signals present, the undesirable max peak output, or some other changing input.

Each of the 'N' signals is compared in a threshold detection component to a unique or global threshold level stored or calculated by a threshold component. If no thresholds are violated at that time then no time delay is needed. However, if a threshold is breached by one of the signal values at a discrete moment in time then that signal is delayed until the other concurrent signals have small amplitude values at some discrete moment in time. This processing is handled by a delay processor. The threshold detection component outputs are a message input to the delay processor, which the delay processor uses to determine which signals have amplitude threshold violations and, therefore, which signals need to be delayed. A delay component in parallel to the threshold detection component exists so that the delay processor gets the 'N' signals delayed by the same amount of time that it took for the threshold detection component to determine if additional unique signal delays needed to be added.

The delay processor evaluates the 'N' number of signals and determines a locally optimal delay in the number of signals that violate their amplitude threshold value. This delay processor performs this decision based on finding a locally optimal delay for the signals that results in the lowest total peak power for any given time sample within its time window of concern. This time delay may be applied uniformly across the entire time window of concern for each of the violating signals so that an entire burst of data have the same uniform delay across it and the information contained in that signal only experiences a fixed delay across the entire burst or packet.

Once the delay processor has found a locally (across time, among the finite time window of evaluation) optimal delay for the one or more signals that have threshold amplitude violations, it applies the optimal delay(s) and transmits the new 'N' simultaneous signals. The delay processor also sends notice to an excessive peak warning component that can alert both the fact that a power peak was avoided and the resulting maximum power peak value of the transmitted signals.

Figure 6:
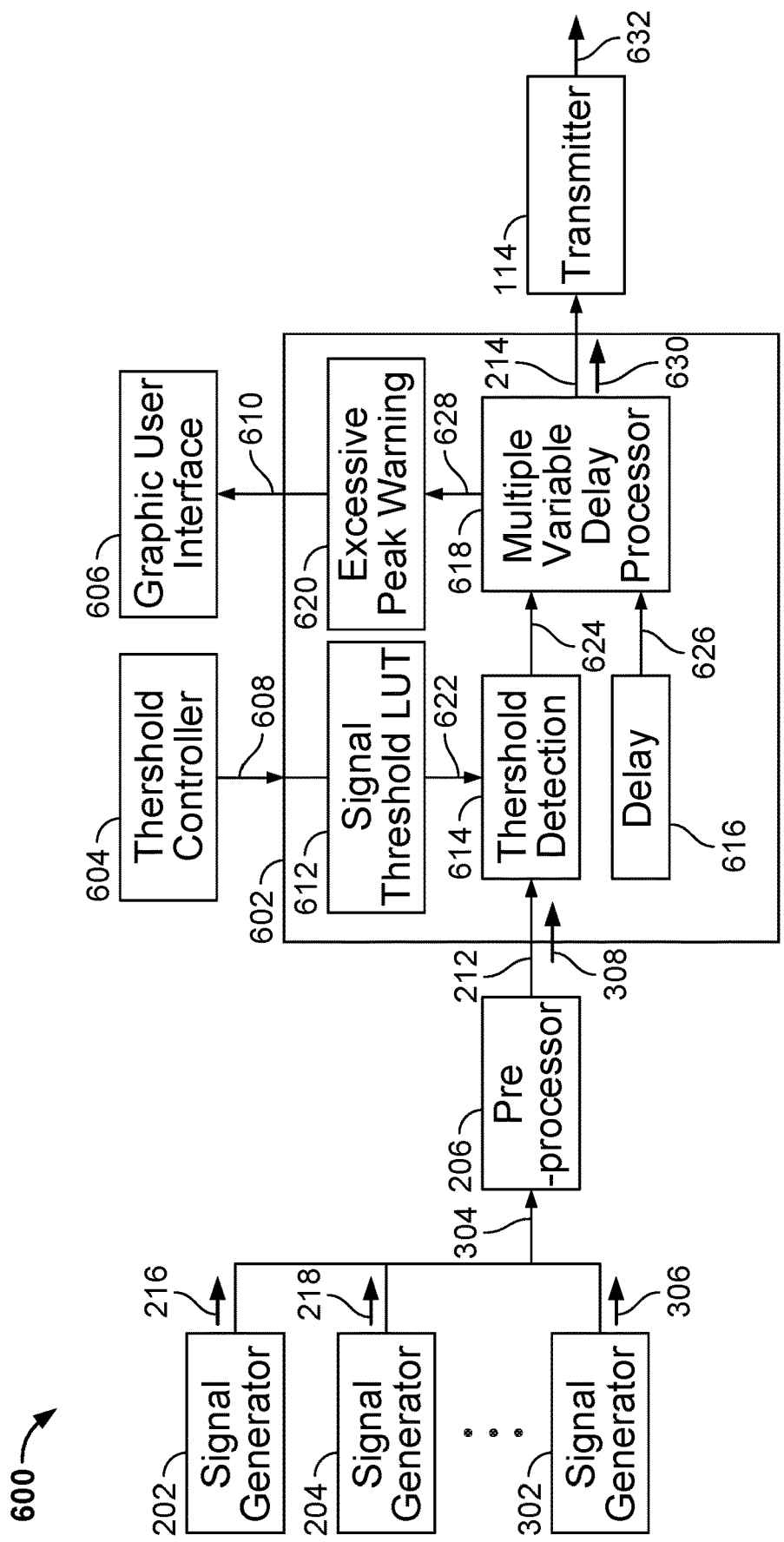
FIG. 6 illustrates an example transmission system in accordance with aspects of the present disclosure.

Aspects of the present disclosure will now be described in greater detail with reference to FIGS. 6-8. FIG. 6 illustrates an example transmission system 600 in accordance with aspects of the present disclosure. As shown in the figure, transmission system 600 includes: a plurality of signal generators, a sample of which are indicated as signal generator 202, signal generator 204 and signal generator 302; pre-processor 206; a signal processor 602; a threshold controller 604; a graphic user interface (GUI) 606 and transmitter 114.

In this example, the plurality of signal generators, pre-processor 206, signal processor 602, threshold controller 604, GUI 606 and transmitter 114 are illustrated as individual devices. However, in some embodiments, at least two of the plurality of signal generators, pre-processor 206, signal processor 602, threshold controller 604, GUI 606 and transmitter 114 may be combined as a unitary device. Further, in some embodiments, at least one of the plurality of signal generators, pre-processor 206, signal processor 602, threshold controller 604, GUI 606 and transmitter 114 may be implemented as a computer having tangible computer-readable media for carrying or having computer-executable instructions or data structures stored thereon. Such tangible computer-readable media can be any available media that can be accessed by a general purpose or special purpose computer. Non-limiting examples of tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. For information transferred or provided over a network or another communications connection (either hardwired, wireless, or a combination of hardwired or wireless) to a computer, the computer may properly view the connection as a computer-readable medium. Thus, any such connection may be properly termed a computer-readable medium. Combinations of the above should also be included within the scope of computer-readable media.

Pre-processor 206 is arranged to communicate with signal processor 602 by way of communication channel 212. Signal processor 602 is additionally arranged to communicate with threshold controller 604 via a communication channel 608, with GUI 606 via a communication channel 610 and with transmitter 114 via communication channel 214.

Signal processor 602 includes a threshold component 612, a threshold detection component 614, a delay component 616, a delay processor 618 and an excessive peak warning component 620.

In this example, threshold component 612, threshold detection component 614, delay component 616, delay processor 618 and excessive peak warning component 620 are illustrated as individual devices. However, in some embodiments, at least two of threshold component 612, threshold detection component 614, delay component 616, delay processor 618 and excessive peak warning component 620 may be combined as a unitary device. Further, in some embodiments, at least one of threshold component 612, threshold detection component 614, delay component 616, delay processor 618 and excessive peak warning component 620 may be implemented as a computer having tangible computer-readable media for carrying or having computer-executable instructions or data structures stored thereon.

Threshold component 612 is arranged to communicate with pre-processor 206 via communication channel 212, to communicate with threshold controller 604 via communication channel 608 and to communicate with threshold detection component 614 via a communication channel 622. Threshold detection component 614 is further arranged to communicate with delay processor 618 via a communication channel 624. Delay processor 618 is additionally arranged to communicate with excessive peak warning component 620 via a communication channel 628, with delay component 616 via a communication channel 626 and with transmitter 114 via communication channel 214. Excessive peak warning component 620 is additionally arranged to communicate with GUI 606 via communication channel 610.

Figure 7:
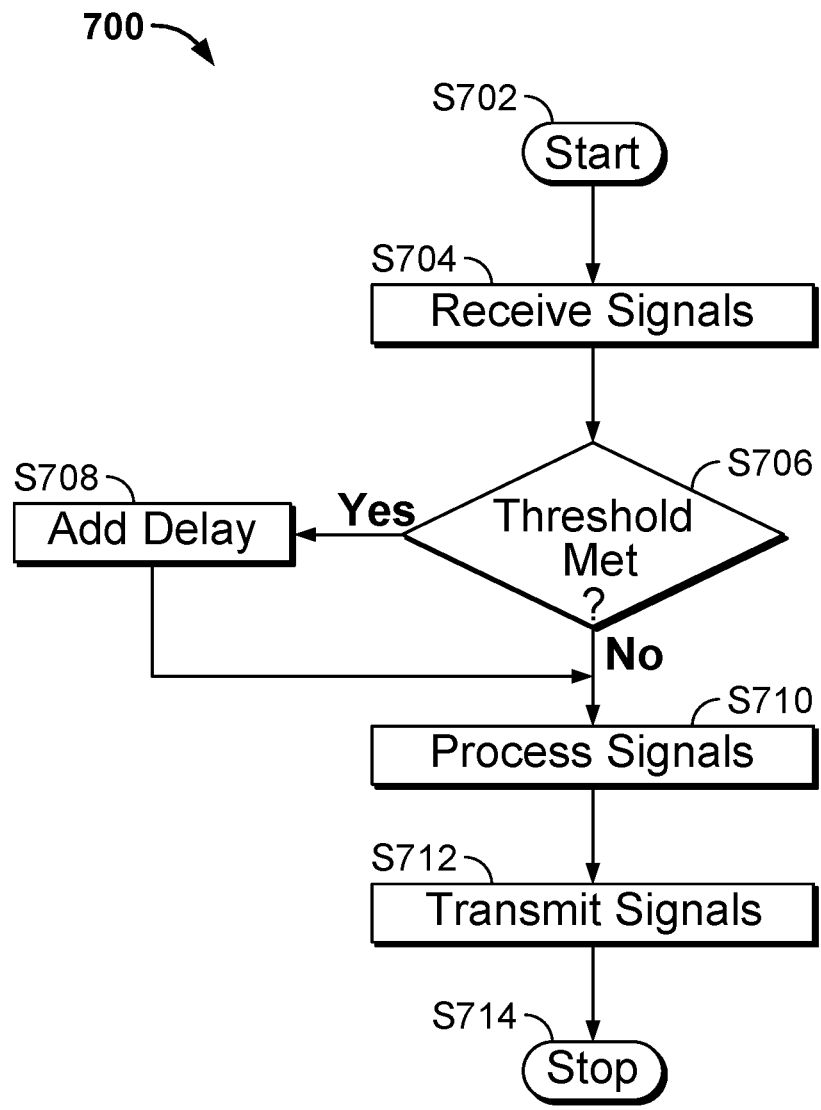
FIG. 7 illustrates an example method of operating the transmission system of FIG. 6 in accordance with aspects of the present disclosure.

FIG. 7 illustrates an example method 700 of operating transmission system 600 of FIG. 6 in accordance with aspects of the present disclosure.

As shown in the figure, method 700 starts (S702) and signals are received (S704). In an example embodiment, threshold detection component 614 receives pre-processed signals corresponding to a sum of the signals generated by signal generators.

For example, the plurality of signal generators generate respective non-continuous signals, a sample of which are indicated as non-continuous signal 216 from signal generator 202, non-continuous signal 218 from signal generator 202 and non-continuous signal 306 from signal generator 302. The plurality of generated signals is provided to pre-processor 206.

Pre-processor 206 may process the plurality of signals in any known manner to address cross-channel interference that might be created in signal processor 602, so as to output pre-processed signals represented by arrow 308.

After the signals are received (S704), it is determined whether a threshold is met (S706). In an example embodiment, threshold detection component 614 may determine whether a threshold is met.

For example, threshold detection component 614 receives the pre-processed signals. Threshold detection component 614 additionally receives a predetermined voltage threshold as provided by threshold component 612. Threshold controller 604 is operable to store the predetermined voltage threshold in threshold component 612. Further, threshold controller 604 is additionally operable to change the predetermined voltage threshold in threshold component 612.

A predetermined voltage threshold may be a saturation voltage of delay processor 618, i.e., a voltage in which delay processor 618 will be driven in saturation, thus causing unacceptable distortion in the amplified signals. For example, a predetermined voltage threshold for the plurality of signal generators might be 2.0 mV, wherein delay processor 618 cannot amplify any signals having an amplitude of 2.0 mV or higher without causing unacceptable distortion in the amplified signals. Therefore, if the sum of the amplitudes of the signals provided by the plurality of signal generators, at any time, is greater than the predetermined threshold voltage, which in this example is 2.0 mV, then delay processor 618 will ultimately add a time delay to at least one of the signals such that the sum of the amplitudes of the signals (that include the newly delayed signal) would be below the predetermined threshold.

Threshold detection component 614 then checks a time sample in the sum of the maximum amplitudes of pre-processed signals, at any time, to see if the time sample is above (in absolute value) the predetermined voltage threshold. In an example embodiment, this may be a look-up table (LUT) where each signal type has a static preset peak voltage threshold value, whereas in another example embodiment this may be a dynamically moving value based on the number of signals present, the undesirable max peak output, or some other changing input.

The pre-processed signals may be sampled at a predetermined sampling rate. As the sampling rate increases, more processing power is required. Accordingly, a system design will take into account the tradeoff of the sampling rate versus processing resources. For purposes of discussion, let the sampling rate be 1.0 ms, wherein the voltage amplitudes of each of the pre-processed signals are sampled every 1.0 ms. The sampled voltage amplitudes are summed, and that sum is compared to the predetermined voltage threshold. If the sum, during any sampling, is greater than the predetermined voltage threshold, then at least one of the pre-processed signals will be delayed.

If a threshold is met (Y at S706), then a delay is added (S708). In an example embodiment, delay component 616 provides a delay instruction.

In an example embodiment, delay component 616 provides a delay instruction to delay processor 618. In other example embodiments, threshold detection component 614 instructs delay component 616 to provide the delay instruction to delay processor 618 when the pre-processed signals, which are a preprocessed version of the sum of non-continuous signals 216, 218 and 306, is greater than the predetermined threshold value.

In some example embodiments, the amount of the delay in the delay instruction may be predetermined. In other example embodiments, the amount of the delay in the delay instruction may be changed, for example via GUI 606. In an example embodiment, the delay that is to be added is predetermined to be 45 ms, however any amount of time may be used in accordance with aspects of the present disclosure.

Further, threshold detection component 614 generates a modification required signal when a time sample in the sum of the maximum amplitudes of pre-processed signals is above (in absolute value) the predetermined voltage threshold. This modification required signal will instruct delay processor 618 to modify at least one of the pre-processed signals by adding a delay as instructed by the delay instruction from delay component 616. This will be described with additional reference to FIGS. 8A-C.

FIG. 8A illustrates graph 402 associated with signal 416 of signal generator 302 of transmission system 300. FIG. 8B illustrates a graph 802 associated with a signal 812 of signal generators 202 and 204 of transmission system 600 of FIG. 6 as delayed in accordance with aspects of the present disclosure. FIG. 8C illustrates a graph 804 associated with a sum of signal 416 and signal 812.

Graph 802 has a y-axis 806 of voltage and an x-axis 808 of time. Graph 804 has a y-axis 814 of voltage and an x-axis 816 of time.

It should be noted that signal 812 in graph 802 is provided for discussion purposes only, wherein the signals generated by signal generator 202 and signal generator 204 are not independently added together separately from the signals generated by the other signal generators. In particular the graphs of FIGS. 8A-C are provided to illustrate how transmission system 600 solves the problem when an additional signal generator is added to a transmission system that has an HPA that is designed for less than the number of signal generators being used, which is the situation described above with reference to transmission system 300 of FIG. 3.

As shown in graph 402, signal 416 has a maximum amplitude of approximately 1.0 mV at position 426, which corresponds to the time of 125 ms, which is indicated by dotted line 822.

As shown in graph 802, signal 812 has a maximum amplitude of approximately 1.0 mV at position 824, which corresponds to a time of 80 ms and which is indicated by dotted line 826. In this example signal 812 corresponds to signal 410 of graph 400 of FIG. 4A, with the addition of a 45 ms delay.

In particular, in this example, a delay is added to the sum of the combination of pre-processed signals that correspond to non-continuous signal 216 from signal generator 202 and non-continuous signal 218 from signal generator 218. As a result, the sum of the combination of pre-processed signals that correspond to non-continuous signal 216 from signal generator 202 and non-continuous signal 218 from signal generator 204, which would have been signal 410 of FIG. 4A, is now signal 812, which is signal 410 time-shifted by 45 ms.

In FIGS. 8A-B, as a result of the time delay added to the sum of the combination of pre-processed signals that correspond to non-continuous signal 216 from signal generator 202 and non-continuous signal 218 from signal generator 204, the maximum amplitude of signal 812 is not aligned with the maximum amplitude of signal 416.

The superposition (sum) of signal 416 and signal 812 is illustrated as signal 818 in graph 804. Signal 818 has a maximum amplitude of approximately 1.0 mV at position 828, which corresponds to the time of 80 ms, which is along dotted line 826.

For purposes of discussion, let signal processor 602 operate at saturation at a voltage of 1.5 mV. If such is the case, in FIG. 8C, at no time will the amplitude (absolute value) of signal 818 surpass the saturation of signal processor 602.

Accordingly, amplified signal 630 that is output by signal processor 602 will always have an acceptable amount of distortion, or in other words, an acceptable signal to noise ratio.

In an example embodiment, delay processor 618 may continue to delay at least one of the pre-processed signals until a time sample in the sum of the maximum amplitudes of pre-processed signals is below (in absolute value) the predetermined voltage threshold.

In other example embodiments, delay processor 618 provides a predetermine delay amount as indicated by delay component 616, to at least one of the pre-processed signals and then determines whether the time sample in the sum of the maximum amplitudes of pre-processed signals is below (in absolute value) the predetermined voltage threshold. If after the predetermined delay amount is added to at least one of the pre-processed signals and the time sample in the sum of the maximum amplitudes of pre-processed signals is still not below (in absolute value) the predetermined voltage threshold, then delay processor 618 provides another pre-determine delay amount as indicated by delay component 616, to the previously modified pre-processed signals. This process is repeated until the time sample in the sum of the maximum amplitudes of pre-processed signals is below (in absolute value) the predetermined voltage threshold.

Further, signal processor 602 may instruct excessive peak warning component 620 of the excessive peak in the sum of the combination of pre-processed signals that correspond to non-continuous signal 216 from signal generator 202 and non-continuous signal 218 from signal generator 204, for example as illustrated by position 828 in graph 804 of FIG. 8C.

Excessive peak warning component 620 may then generate a warning signal to instruct GUI 606 in provide an indication of the signal modification that was applied to address the excessive peak. Non-limiting examples of indications include images, sounds and combinations thereof. For example, in a non-limiting example, GUI 606 may include a graphic display that displays a prompt indicating signal generator has been delayed, and by what amount.

It should be noted that transmission system 600 is particularly useful in situations where the signals generated by signal generators 202, 204 and 302 are not particularly time sensitive, such as for example in cases that involve global positioning system (GPS) timing signals. As such, minor delays that may be added to the generated signals prior to amplification will not affect the overall purpose of the generated signals.

If it is determined that the threshold was not met (N at S706), then the signals are processed (S710). In an example embodiment, delay processor 618 processes the signals.

For example, threshold detection component 614 generates a modification not required signal when a time sample in the sum of the maximum amplitudes of pre-processed signals is not above (in absolute value) the predetermined voltage threshold. This modification not required signal will instruct delay processor 618 to amplify the pre-processed signals in a manner similar to a prior art HPA, as discussed above for example with reference to FIG. 1.

After a delay is added (S708) or if the threshold was not met (N at S706), then the signals are processed (S710). In an example embodiment, delay processor 618 processes the signals.

For example, delay processor 618 will amplify signals in a manner similar to an HPA. In accordance with aspects of the present disclosure, delay processor 618 will output amplified pre-processed signals in one of two manners: 1) when a time sample in the sum of the maximum amplitudes of pre-processed signals is above (in absolute value) the predetermined voltage threshold, delay processor 618 will amplify modified pre-processed signals wherein at least one pre-processed signal will have had a delay added thereto to shift a maximum amplitude as discussed above; and 2) when a time sample in the sum of the maximum amplitudes of pre-processed signals is not above (in absolute value) the predetermined voltage threshold, delay processor 618 will amplify unmodified pre-processed signals in a manner similar to a prior art HPA.

After the signals are processed (S710), the signals are transmitted (S712). In an example embodiment, transmitter 114 transmits output signals. For example, delay processor 618 of signal processor 602 outputs amplified signal 630 to transmitter 114. Transmitter 114 then transmits output signal 632. After the signals are transmitted (S712), method 700 stops (S714).

A system in accordance with the present disclosure will save analog peak power requirements and reduce the requirements on analog front end circuitry in multicarrier bursted waveform systems. This will allow for smaller simpler system designs due to the digital processing preventing large voltage and power peaks.

The foregoing description of various embodiments have been presented for purposes of illustration and description. It is not intended to be exhaustive or to limit the disclosure to the precise forms disclosed, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

What is claimed as new and desired to be protected by Letters Patent of the United States is:

1. A signal processor for use with a first signal generator and a second signal generator, the first signal generator being operable to provide a first signal having a first amplitude at a first time period the second signal generator being operable to provide a second signal having a second amplitude at a second time period the signal processor comprising:

a threshold component operable to store a threshold value;

a threshold detection component operable to generate a sum of the first amplitude and the second amplitude, to compare the sum with the threshold value, to generate a modification required signal when the sum is greater than the threshold value and to generate a modification not-required signal when the sum is less than or equal to the threshold value;

a delay component operable to generate a delay signal;

a delay processor operable to output a first output signal based on the sum when the sum is less than or equal to the threshold, to generate a modified first signal by applying a time delay to the first signal when the sum is greater than the threshold value and to output a second output signal based on the sum of the modified first signal and the second signal when the sum is greater than the threshold value;

further comprising a transmitter operable to transmit one of the first output signal and the second output signal; and further comprising an excessive peak warning component operable to generate a warning signal based on the sum.

2. The signal processor of claim 1, further comprising a threshold controller operable to change the threshold value.

3. A method of operating a transmission system comprising:

provided, via a first signal generator, a first signal having a first amplitude at a first time period;

providing, via a second signal generator, a second signal having a second amplitude at a second time period;

storing, into a threshold component, a threshold value;

generating, via a threshold detection component, a sum of the first amplitude and the second amplitude;

comparing, via the threshold detection component, the sum with the threshold value;

generating, via the threshold detection component, a modification required signal when the sum is greater than the threshold value;

generating, via the threshold detection component, a modification not required signal when the sum is less than or equal to the threshold value;

generating, via a delay component, a delay signal indicating a delay amount;

outputting, via a delay processor, a first output signal based on the sum when the sum is less than or equal to the threshold;

generating, via the delay processor, a modified first signal by applying a time delay of the delay amount to the first signal when the sum is greater than the threshold value;

outputting, via the delay processor, a second output signal based on the sum of the modified first signal and the second signal when the sum is greater than the threshold value;

further comprising transmitting, via a transmitter, one of the first output signal and the second output signal, and further comprising generating, via an excessive peak warning component, a warning signal based on the sum.

4. The method of claim 3, further comprising changing, via a threshold controller, the threshold value.

5. A non-transitory, tangible, computer-readable media having computer-readable instructions stored thereon, the computer-readable instructions being capable of being read by a computer and being capable of instructing the computer to perform the method comprising:

providing, via a first signal generator, a first signal having a first amplitude at a first time period;

providing, via a second signal generator, a second signal having a second amplitude at a second time period;

storing, into a threshold component, a threshold value;

generating, via a threshold detection component, a sum of the first amplitude and the second amplitude;

comparing, via the threshold detection component, the sum with the threshold value;

generating, via the threshold detection component, a modification required signal when the sum is greater than the threshold value;

generating, via the threshold detection component, a modification not required signal when the sum is less than or equal to the threshold value;

generating, via a delay component, a delay signal indicating a delay amount;

outputting, via a delay processor, a first output signal based on the sum when the sum is less than or equal to the threshold;

generating, via the delay processor, a modified first signal by applying a time delay of the delay amount to the first signal when the sum is greater than the threshold value;

outputting, via the delay processor, a second output signal based on the sum of the modified first signal and the second signal when the sum is greater than the threshold value;

transmitting, via a transmitter, one of the first output signal and the second output signal; and the computer-readable instructions being capable of instructing the computer to perform the method further comprising generating, via an excessive peak warning component, a warning signal based on the sum.

6. The non-transitory, tangible, computer-readable media of claim 5, the computer-readable instructions being capable of instructing the computer to perform the method further comprising changing, via a threshold controller, the threshold value.

* * * * *